United States Patent
Ohta et al.

(10) Patent No.: US 8,691,368 B2
(45) Date of Patent: Apr. 8, 2014

(54) THERMALLY CONDUCTIVE SHEET AND METHOD OF MANUFACTURING THE SAME

(75) Inventors: Mitsuru Ohta, Funabashi (JP); Motoki Ozawa, Yokohama (JP); Yoshiaki Okabayashi, Sano (JP)

(73) Assignee: Polymatech Co., Ltd., Tokyo (JP)

( * ) Notice: Subject to any disclaimer, the term of this patent is extended or adjusted under 35 U.S.C. 154(b) by 1374 days.

(21) Appl. No.: 12/079,399

(22) Filed: Mar. 26, 2008

(65) Prior Publication Data

US 2008/0241488 A1 Oct. 2, 2008

(30) Foreign Application Priority Data

Mar. 29, 2007 (JP) ................................ 2007-089859

(51) Int. Cl.
*B32B 3/10* (2006.01)

(52) U.S. Cl.
USPC ........ 428/201; 428/195.1; 428/198; 428/206; 165/185

(58) Field of Classification Search
USPC ......... 428/198, 212, 195.1, 201, 206; 156/60; 165/185
See application file for complete search history.

(56) References Cited

U.S. PATENT DOCUMENTS

| | | | | |
|---|---|---|---|---|
| 6,311,769 | B1 * | 11/2001 | Bonneville et al. | 165/185 |
| 2003/0129352 | A1 * | 7/2003 | Takahashi | 428/68 |
| 2003/0207128 | A1 * | 11/2003 | Uchiya et al. | 428/447 |
| 2007/0001292 | A1 | 1/2007 | Ohta et al. | |

FOREIGN PATENT DOCUMENTS

| | | | |
|---|---|---|---|
| EP | 453 764 | A1 | 10/1991 |
| JP | 2001-110965 | | 4/2001 |
| JP | 2001294676 | A * | 10/2001 |
| JP | 2002-305271 | | 10/2002 |
| JP | 2003-168882 | * | 6/2003 |
| JP | 2003-168882 | A | 6/2003 |
| JP | 2004-243650 | A | 9/2004 |
| JP | 2005-57088 | A | 3/2005 |
| JP | 2007-012911 | | 1/2007 |
| TW | 345667 | A | 11/1998 |
| TW | 200508283 | A | 3/2005 |
| TW | 200520674 | A | 6/2005 |

OTHER PUBLICATIONS

Machine Translation of JP 20011294676.*

* cited by examiner

*Primary Examiner* — Mark Ruthkosky
*Assistant Examiner* — Christopher Polley
(74) *Attorney, Agent, or Firm* — Seager, Tufte & Wickhem LLC

(57) ABSTRACT

A thermally conductive sheet comprises a thermally conductive polymer layer, an adhesive layer provided on an outer surface of the thermally conductive polymer layer, and a thermal diffusion layer, which is a functional layer provided on the adhesive layer. The thermally conductive polymer layer is formed of a thermally conductive polymer composition containing a polymer matrix and a thermally conductive filler. The coefficient of static friction of the thermally conductive polymer layer is 1.0 or lower. The adhesive layer has an outer shape smaller than that of the thermally conductive polymer layer.

12 Claims, 7 Drawing Sheets
(1 of 7 Drawing Sheet(s) Filed in Color)

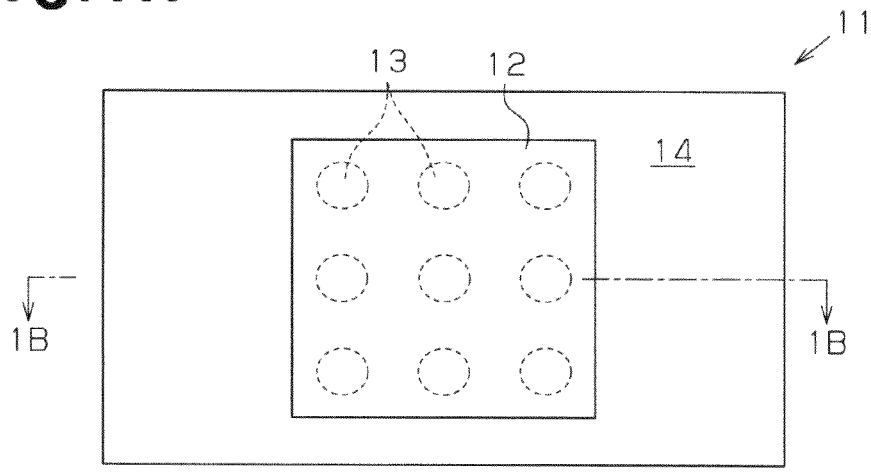
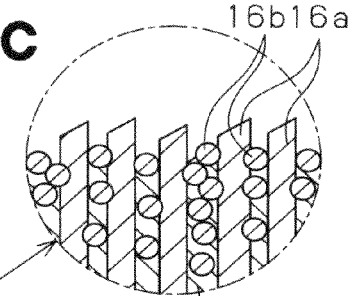
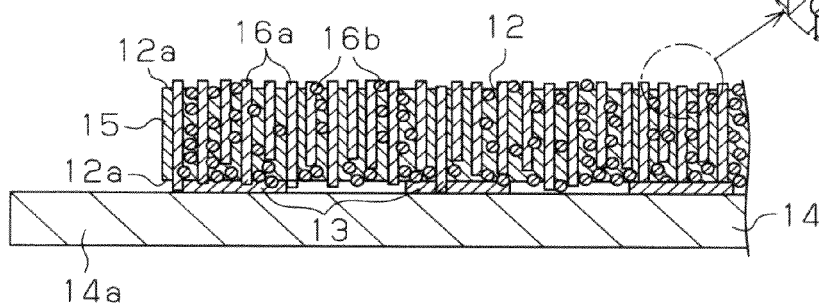
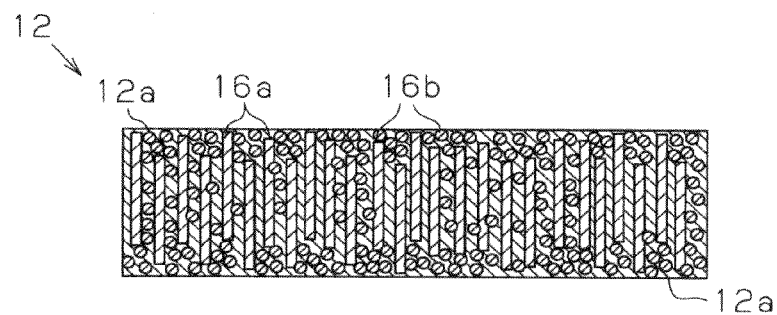

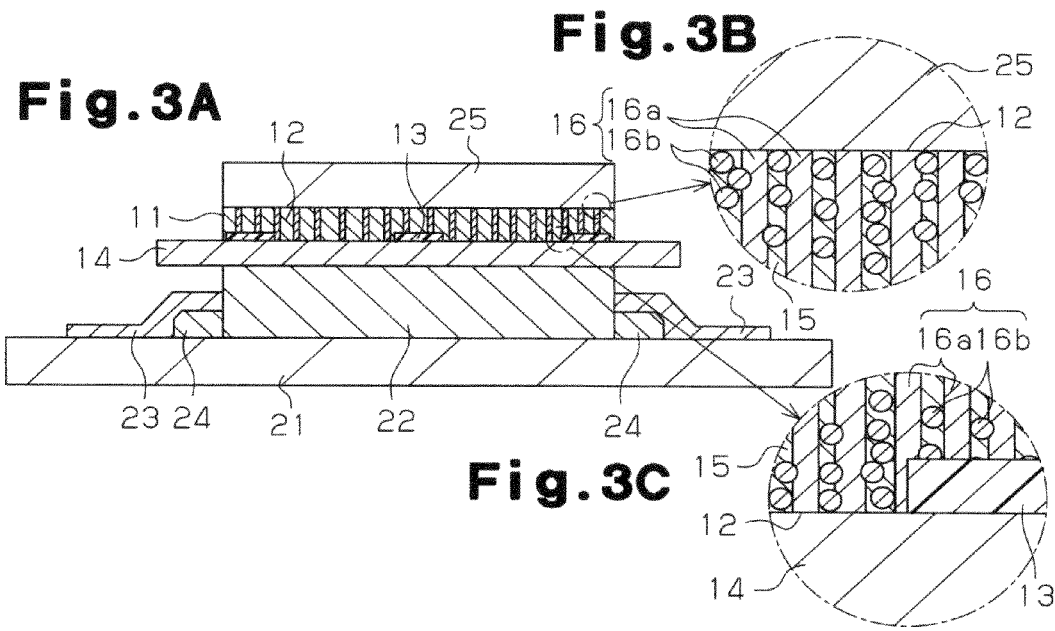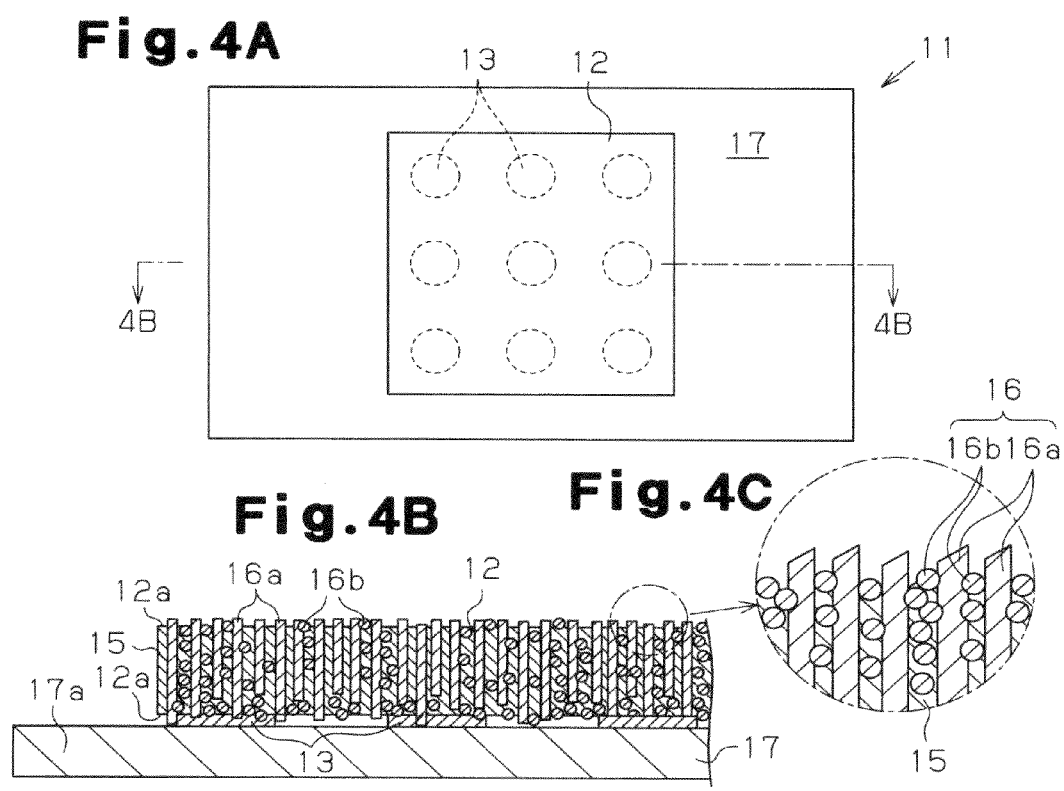

THERMALLY CONDUCTIVE SHEET AND METHOD OF MANUFACTURING THE SAME

BACKGROUND OF THE INVENTION

The present invention relates to a thermally conductive sheet used to release heat generated by semiconductor devices and various types of electronic parts which are heat emitting bodies and a method of manufacturing the same.

Thermally conductive sheets, thermally conductive grease, thermally conductive adhesives, phase change members having thermal conductivity and the like are inserted between heat emitting bodies mounted on circuit boards for conventional electronics and heat discharging bodies in order to release heat generated by the heat emitting bodies. Specific examples of heat emitting bodies include semiconductor devices and electronic parts. Specific examples of heat discharging bodies include heat sinks and cooling fans. In recent years, the power consumption and amount of heat emission of electronic parts have increased as the functions and performance of electronics have increased. In addition, the space within the housing of electronics for arranging members, such as circuit boards, has been becoming smaller as the scale and the thickness of electronics have been reduced. When heat accumulates in electronic parts, for example, the processing performance in the electronic parts decreases, it becomes easy for the electronic parts to be damaged, and the higher temperature is unpleasant for the user of the electronic device. Thus, it is necessary to avoid heat accumulation in heat emitting bodies, for example in electronic parts and the like, and cooling of heat emitting bodies has become an important goal. Therefore, excellent thermal conductivity is required for thermally conductive sheets and the like.

In addition, thermal diffusion sheets formed of graphite or a metal material, for example, are used in order to effectively diffuse heat generated by a heat emitting body within the limited space inside the housing. In particular, it is necessary to avoid local heat accumulation in mobile devices of which the scale and thickness are small and where the density of heat emission is high. Thus, a thermal diffusion sheet having excellent properties in terms of thermal diffusion has been required. In the case where a thermal diffusion sheet makes direct contact with a heat emitting body, the thermal diffusion sheet does not stick to the shape of the contour of the heat emitting body, due to the high rigidity of the graphite or metal material that forms the thermal diffusion sheet. Therefore, the thermal diffusion sheet cannot make sufficiently close contact with the heat emitting body, and thus, excellent properties in terms of thermal diffusion cannot be gained.

Japanese Laid-Open Patent Publication No. 2003-168882, Japanese Laid-Open Patent Publication No. 2005-57088 and Japanese Laid-Open Patent Publication No. 2004-243650 disclose thermally conductive sheets where a flexible thermally conductive polymer layer is layered on at least one side of a thermal diffusion layer formed of, for example, graphite, in order to gain excellent properties in terms of thermal diffusion. Various functions are required, in addition to the above described properties in terms of thermal diffusion, for thermally conductive sheets, depending on where they are used. However, the thermally conductive sheets described in the above described gazettes do not meet these requirements.

SUMMARY OF THE INVENTION

An object of the present invention is to provide a thermally conductive sheet which is more appropriate for use in applications where heat release from heat emitting bodies is required. The present invention also relates to a method of manufacturing the thermally conductive sheet.

To achieve the foregoing and in accordance with a first aspect of the present invention, a thermally conductive sheet is provided. The thermally conductive sheet includes a thermally conductive polymer layer formed of a thermally conductive polymer composition, an adhesive layer provided on an outer surface of the thermally conductive polymer layer, and a functional layer provided on the adhesive layer. The thermally conductive polymer composition contains a polymer matrix and a thermally conductive filler. The coefficient of static friction of the thermally conductive polymer layer is 1.0 or lower. The adhesive layer and the thermally conductive polymer layer each have an outer shape and the outer shape of the adhesive layer is smaller than the outer shape of the thermally conductive polymer layer.

In accordance with a second aspect of the present invention, a method for manufacturing a thermally conductive sheet is provided. The method includes: forming a thermally conductive polymer layer of a thermally conductive polymer composition containing a polymer matrix and a thermally conductive filler in which the coefficient of static friction of the thermally conductive polymer layer is 1.0 or lower and the thermally conductive polymer layer includes an outer shape; providing an adhesive layer on an outer surface of the thermally conductive polymer layer in which the adhesive layer has an outer shape smaller than the outer shape of the thermally conductive polymer layer; and providing a functional layer on the adhesive layer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The invention, together with objects and advantages thereof, may best be understood by reference to the following description of the presently preferred embodiments together with the accompanying drawings in which:

FIG. 1A is a plane diagram showing a first embodiment of a thermally conductive sheet in accordance with the present invention;

FIG. 1B is a cross sectional diagram along line 1B-1B of FIG. 1A;

FIG. 1C is an enlarged cross sectional diagram showing a polymer layer;

FIG. 2 is a cross sectional diagram showing the step of manufacturing a thermally conductive sheet;

FIG. 3A is a cross sectional diagram showing the attachment of a thermally conductive sheet to a heat emitting body;

FIG. 3B is an enlarged cross sectional diagram showing a thermally conductive polymer layer and a heat discharging body;

FIG. 3C is an enlarged cross sectional diagram showing a thermally conductive polymer layer and a thermal diffusion layer;

FIG. 4A is a cross sectional diagram showing the thermally conductive sheet according to a second embodiment;

FIG. 4B is a cross sectional diagram along line 4B-4B of FIG. 4A;

FIG. 4C is an enlarged cross sectional diagram showing a polymer layer;

DETAILED DESCRIPTION OF THE PREFERRED EMBODIMENTS

First Embodiment

Figure 5:
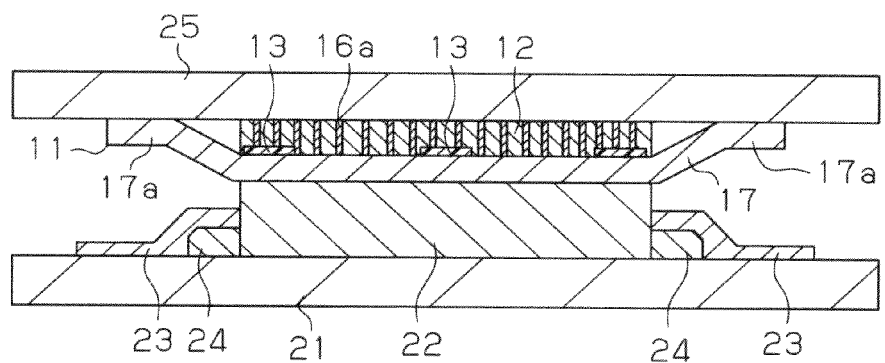
FIG. 5 is a cross sectional diagram showing the attachment of a thermally conductive sheet to a heat emitting body.

In the following, first embodiment of a thermally conductive sheet in accordance with the present invention is described with reference to the drawings. As shown in FIGS. 1A to 1C, the thermally conductive sheet 11 according to the present embodiment comprises a thermally conductive polymer layer 12 formed of a thermally conductive polymer composition, an adhesive layer 13 formed on the outer surface 12a of the thermally conductive polymer layer 12, and a thermal diffusion layer 14, which is a functional layer formed on the adhesive layer 13. The layers are in the order of: thermal diffusion layer 14, adhesive layer 13, thermally conductive polymer layer 12, from the bottom. In the following description, the thermally conductive sheet 11 is simply referred to as sheet 11, the thermally conductive polymer composition is simply referred to as composition, and the thermally conductive polymer layer 12 is simply referred to as polymer layer 12. The sheet 11 is inserted between a heat emitting body and a heat discharging body, for example, for use, so that heat is discharged from the hot heat emitting body and the heat emitting body is cooled.

The sheet 11 is provided with a cooling function and is easy to handle. The cooling function is an index for ease of cooling a hot heat emitting body, and based on the thermal conductivity of the polymer layer 12 and the properties of the thermal diffusion layer 14 in terms of thermal diffusion. That is to say, the cooling function is based on the thermal conductivity of the polymer layer 12, the value of the thermal resistance of the polymer layer 12, the adhesion between the heat emitting body or heat discharging body and the polymer layer 12, as well as that between the thermal diffusion layer 14 and the polymer layer 12, and the properties of the thermal diffusion layer 14 in terms of thermal diffusion. The higher the thermal conductivity of the polymer layer 12 is, the smaller the value of the thermal resistance of the polymer layer 12 is, the stronger the adhesion between the heat emitting body or heat discharging body and the polymer layer 12, as well as that between the thermal diffusion layer 14 and the polymer layer 12, is, and the better the properties of the thermal diffusion layer 14 in terms of thermal diffusion are, the better the cooling function of the sheet 11.

The ease of handling is an index for the ease of handling when the sheet 11 is carried and the like, and mainly based on the adhesiveness of the polymer layer 12. The smaller the adhesiveness of the polymer layer 12, the easier the sheet 11 is to handle when carried, and thus, the ease of handling is high.

The composition contains a polymer matrix and a thermally conductive filler. The polymer matrix holds the thermally conductive filler within the polymer layer 12. The polymer matrix is selected in accordance with the performance required for the polymer layer 12, for example mechanical strength, hardness, durability, resistance to heat, and electrical properties. Specific examples of the polymer matrix include silicone resin.

The thermally conductive filler increases the thermal conductivity of the polymer layer 12 so that the cooling function of the sheet 11 increases. Specific examples for the form of the thermally conductive filler include fiber, particle, and plate forms. Preferably, at least part of the thermally conductive filler is in fiber form. In the following, a thermally conductive filler in fiber form, that is to say, a sheet 11 containing a filler in fiber form, is described. Specific examples of the filler in fiber form include carbon fibers and poly(p-phenylenebenzobisoxazole) precursor carbon fibers (PBO carbon fibers). Specific examples of materials for thermally conductive fillers having a form other than fiber form, that is to say, fillers in non-fiber form include aluminum oxide and aluminum hydroxide.

It is preferable for the thermally conductive filler content in the composition to be 90 mass % or less. In the case where the thermally conductive filler content exceeds 90 mass %, the polymer layer 12 becomes fragile, because the flexibility of the polymer layer 12 is low, and at the same time, there is a risk that the polymer layer 12 may not stick to the shape of the contour of the heat emitting body and the heat discharging body as much. The composition may contain a plasticizer for adjusting the hardness of, for example, the polymer layer 12, and a stabilizer for enhancing the durability, in addition to the above described components.

The polymer layer 12 is in quadrilateral form and accelerates thermal conduction from the heat emitting body to the heat discharging body so that the hot heat emitting body is cooled. The polymer layer 12 is provided with a polymer matrix 15 and a thermally conductive filler 16. The thermally conductive filler 16 according to the present embodiment has a thermally conductive filler 16 in fiber form, that is to say, filler in fiber form 16a and a thermally conductive filler 16 in particle form, that is to say, a filler in particle form 16b. The filler in fiber form 16a is oriented in one direction. In the polymer layer 12 shown in FIGS. 1B and 1C, for example, the filler in fiber form 16a is oriented in the direction of the thickness of the polymer layer 12. Therefore, the value of the thermal conductivity of the polymer layer 12 in the direction of the thickness is equal to the value gained by multiplying the value of the thermal conductivity in the direction of the width by two to several hundred. The end portions of the filler in fiber form 16a extend in the direction of the width of the polymer layer 12 and are exposed on pairs of facing outer surfaces 12a.

The adhesiveness of the polymer layer 12 is very small, and therefore, the adhesiveness of the polymer layer 12 can be indicated using the coefficient of static friction of the polymer layer 12. That is to say, in the case where the coefficient of static friction of the polymer layer 12 is low, the adhesiveness of the polymer layer 12 is low, while in the case where the coefficient of static friction of the polymer layer 12 is high, the adhesiveness of the polymer layer 12 is high. The coefficient of static friction of the polymer layer 12 is 1.0 or lower, preferably 0.3 or lower. In the case where the coefficient of static friction of the polymer layer 12 exceeds 1.0, it becomes difficult to attach the sheet 11 to the heat emitting body, for example, due to excessively high adhesiveness of the polymer layer 12. The lower limit for the coefficient of static friction of the polymer layer 12 is not particularly limited, and the smaller the coefficient of static friction of the polymer layer 12 is, the easier it is to attach the sheet 11 to the heat emitting body, for example. In the case where the coefficient of static friction of the polymer layer 12 is 1.0 or lower, the polymer layer 12 is not sticky when the outer surfaces 12a of the polymer 12 are touched with the fingers, and thus, the polymer layer 12 does not adhere to the thermal diffusion layer 14 through its own adhesiveness.

The thickness of the polymer layer 12 is preferably 0.03 mm to 0.5 mm. In the case where the thickness of the polymer layer 12 is less than 0.03 mm, the manufacture of the polymer layer 12 becomes difficult. In the case where the thickness of the polymer layer 12 exceeds 0.5 mm, it takes time for the heat to conduct from the heat emitting body to the heat discharging body, and there is a risk that the cooling function of the sheet 11 may deteriorate. Polymer layers 12 having a thickness of 0.5 mm or less easily become flexible, due to the material.

The hardness of the polymer layer 12 as measured in accordance with the type E of JIS K 6253, which is a Japanese Industrial Standard (ISO 7619-1, which is an international standard), is 5 to 80, for example. In the case where the hardness of the polymer layer 12 is less than 5, the polymer layer 12 is too flexible, and therefore, the ease of handling of the sheet 11 deteriorates. Thus, it becomes difficult to handle the sheet 11. In the case where the hardness of the polymer layer 12 exceeds 80, the adhesion between the polymer layer 12 and the heat emitting body or heat discharging body decreases, and there is a risk that the cooling function of the sheet 11 may deteriorate.

The outer shape of the adhesive layer 13 is smaller than the outer shape of the polymer layer 12, and in multi-dot form throughout the entirety of the outer surfaces 12a of the polymer layer 12. The adhesive layer 13 holds the polymer layer 12 and the thermal diffusion layer 14 together through the adhesive layer 13.

Specific examples of the material for the adhesive layer 13 include acryl based, silicone based, urethane based, vinyl based and synthetic rubber based gluing agents and adhesives. The adhesive layer 13 is formed through application of a material for forming the adhesive layer 13 to the polymer layer 12. Furthermore, the adhesive layer 13 may be formed of an adhesive tape where the above described adhesive is applied to a polymer film, which has the same effects. In addition, the polymer layer 12 easily adheres to the thermal diffusion layer 14, and therefore, it is preferable for the material for the adhesive layer 13 to have flexibility.

The ratio of the area occupied by the adhesive layer 13 to the entirety of the outer surfaces 12a on the outer surfaces 12a to which the adhesive layer 13 of the polymer layer 12 is attached is preferably 30% or less. The thermal conductivity of the adhesive layer 13 and the properties of the adhesive layer 13 in terms of thermal diffusion are poor in comparison with the thermal conductivity of the polymer layer 12 and the properties of the thermal diffusion layer 14 in terms of thermal diffusion. Therefore, when the ratio of the area occupied by the adhesive layer 13 exceeds 30%, there is a risk that the cooling function of the sheet 11 may deteriorate excessively.

The thickness of the adhesive layer 13 is preferably 50 μm or less. In the case where the thickness of the adhesive layer 13 exceeds 50 μm, the difference between the outer surface of the polymer layer 12 and the surface of the adhesive layer 13 becomes great due to the thickness of the adhesive layer 13. Therefore, there is a risk that the adhesion between the polymer layer 12 and the thermal diffusion layer 14 may decrease, and the value of the thermal contact resistance of the sheet 11 may become high when the sheet 11 is attached to a heat emitting body, for example. As described above, the thermal conductivity of the adhesive layer 13 is poor in comparison with the thermal conductivity of the polymer layer 12. Thus, the lower limit for the thickness of the adhesive layer 13 is not particularly limited, and the thinner the adhesive layer 13, the higher the adhesion between the polymer layer 12 and the thermal diffusion layer 14 becomes, and the lower the ratio of the adhesive layer 13 in the direction of the thermal conductance in the sheet 11 becomes. Thus, the lower the value of the thermal contact resistance of the sheet 11 becomes.

The thermal diffusion layer 14 is in quadrilateral form and allows heat to diffuse from the hot heat emitting body, and thus, prevents heat from accumulating within the heat emitting body and in the vicinity of the heat emitting body, so that the cooling function of the sheet 11 improves. The thermal diffusion layer 14 is formed of a graphite sheet or a sheet made of a metal, for example. Specific examples of the material for the sheet made of a metal include copper and aluminum. The thermal diffusion layer 14 allows heat to diffuse in the direction parallel to the surface, due to the quality of the material, and releases diffused heat to the outside from the peripheral and the surface of the thermal diffusion layer 14. Therefore, the thermal diffusion layer 14 is preferably formed of a graphite sheet. Graphite sheets usually have high thermal conductivity in the direction parallel to the surface, in comparison with the thermal conductivity in the direction of the thickness. Concretely, the thermal conductivity in the direction parallel to the surface of the graphite sheet is 100 W/m·K to 800 W/m·K. The graphite sheet allows heat to diffuse in such a manner as to be conveyed more quickly in the direction parallel to the surface than in the direction of the thickness.

As shown in FIGS. 1A and 1B, the outer shape of the thermal diffusion layer 14 is larger than the outer shape of the polymer layer 12, and the peripheral portion 14a of the thermal diffusion layer 14 is exposed. The thickness of the thermal diffusion layer 14 is preferably 10 μm to 150 μm. In the case where the thickness of the thermal diffusion layer 14 is less than 10 μm, the thermal diffusion layer 14 is fragile and easily damaged, and the thermal capacity of the thermal diffusion layer 14 is excessively small, and therefore there is a risk that the cooling function of the sheet 11 may not improve sufficiently. In the case where the thickness of the thermal diffusion layer 14 exceeds 150 μm, there is a risk that the efficiency of thermal conduction from the heat emitting body to the heat discharging body may decrease, due to the excessive thickness of the thermal diffusion layer 14.

The sheet 11 is manufactured through a preparation step of preparing a composition, an orientation step of orienting the filler in fiber form 16a, a formation step of forming a polymer layer 12, an exposure step of exposing the filler in fiber form 16a, and a laminating step of laminating an adhesive layer 13 and a thermal diffusion layer 14 on the polymer layer 12 in this order.

In the preparation step, the appropriate components described above are mixed, so that a composition is prepared. In the orientation step, a die, for example, is filled with the composition, and after that, the filler in fiber form 16a is oriented. As the method for orienting the filler in fiber form 16a, a method for applying a magnetic field in the composition using a magnetic field generating apparatus and a method for applying vibration in the composition using a vibration apparatus can be used, and a method for applying both a magnetic field and vibration to the composition is preferable, because the filler in fiber form 16a is easily oriented. At this time, the magnetic field and vibration are applied to the filler in fiber form 16a via the composition.

In the formation step, the polymer matrix 15 is hardened or solidified within the die in such a state that the orientation of the filler in fiber form 16a is maintained, and thus, a polymer layer 12 in predetermined form is formed. As shown in FIG. 2, the filler in fiber form 16a in the polymer layer 12 after the formation step is not exposed from the outer surface 12a of the polymer layer 12. In the exposure step, a blade in mesh form, for example, is pressed against the outer surface 12a of the polymer layer 12, and after that, is slid over the outer surface 12a, and thus, the polymer matrix 15 is removed from the outer surface 12a, so that the filler in fiber form 16a is exposed from the outer surface 12a. In the laminating step, a material for forming an adhesive layer 13 is applied in a predetermined location on the outer surface 12a of the polymer layer 12 in accordance with a well-known method, and thus, the adhesive layer 13 is layered in multi-dot form on the outer surface 12a of the polymer layer 12. Next, a thermal diffusion layer 14 is layered on the adhesive layer 13.

When the sheet 11 is attached to the heat emitting body and the heat discharging body, as shown in FIG. 3A, the sheet 11 is placed on top of the heat emitting body 22 (for example an electronic device) provided on a substrate 21, for example. At this time, the thermal diffusion layer 14 faces the heat emitting body 22. The bottom of the heat emitting body 22 is covered with an electrically insulating layer 23, and terminals 24 for connecting the heat emitting body 22 to an electrical circuit, not shown, on the substrate 21 are provided between the substrate 21 and the electrically insulating layer 23. Subsequently, the heat discharging body 25 is placed on top of the sheet 11, and after that, a load is applied from the heat discharging body 25 to the heat emitting body 22 so that the sheet 11 makes close contact with the heat emitting body 22 and the heat discharging body 25, and thus, the sheet 11 is sandwiched between the heat emitting body 22 and the heat discharging body 25. At this time, as shown in FIGS. 3B and 3C, the end portions of the filler in fiber form 16a exposed from the outer surface of the polymer layer 12 are pressed into the polymer layer 12 as a result of the above described load. Furthermore, the polymer matrix 15 soaks out from between the exposed filler in fiber form 16a as a result of the above described load. Therefore, the above described exposed filler in fiber form 16a is relatively immersed in the polymer matrix 15 within the polymer layer 12, so that the adhesiveness of the polymer layer 12 increases. Furthermore, the polymer layer 12 makes close contact with the thermal diffusion layer 14 and the heat discharging layer 25 without creating a gap between the thermal diffusion layer 14 and the discharging body 25. The value of the load applied to the heat discharging body 25 is, for example, 4.9 N.

The above described embodiment has the following advantages.

The sheet 11 according to the present embodiment comprises a polymer layer 12 and a thermal diffusion layer 14 layered on top of the polymer layer 12 via an adhesive layer 13. Therefore, the sheet 11 allows heat from the heat emitting body 22 to diffuse through the thermal diffusion layer 14, and accelerates thermal conduction from the heat emitting body 22 to the heat discharging body 25 through the polymer layer 12, and thus, an excellent cooling function can be gained.

The coefficient of static friction of the polymer layer 12 is set to 1.0 or lower, and the polymer layer 12 and the thermal diffusion layer 14 are integrally formed using the adhesive layer 13. Therefore, the adhesiveness of the polymer layer 12 decreases, so that ease of handling of the sheet 11 can be increased and the thermal diffusion layer 14 can be attached to the polymer layer 12 having low adhesiveness without fail.

The outer shape of the adhesive layer 13 is smaller than the outer shape of the polymer layer 12, and the adhesive layer 13 according to the present embodiment is in multi-dot form throughout the entirety of the outer surface 12a of the polymer layer 12. Therefore, the cooling function of the sheet 11 can be prevented from deteriorating, due to the adhesive layer 13, in comparison with the case where the adhesive layer 13 is formed on the entirety of the outer surface 12a of the polymer layer 12. Furthermore, the ratio of the area occupied by the adhesive layer 13 to the entirety of the outer surface 12a can be set to 30% or lower on the outer surface 12a of the polymer layer 12, where the adhesive layer 13 is provided, and thus, the cooling function of the sheet 11 can be prevented from deteriorating due to the adhesive layer 13 without fail.

In the case where the adhesive layer 13 is formed in only part of the peripheral portion of the polymer layer 12, for example, there is a risk that a thin and flexible polymer layer 12 may bend toward the thermal diffusion layer 14 or outward in portions where the adhesive layer is not formed. In this case, attachment of the sheet to the heat emitting body 22, for example, becomes difficult. In contrast, according to the present embodiment, the adhesive layer 13 is formed uniformly throughout the entirety of the polymer layer 12, and therefore, the thin and flexible polymer layer 12 can be prevented from bending.

When the thickness of the adhesive layer 13 is set to 50 μm or less, the value of the thermal contact resistance of the sheet 11 can be decreased, so that the cooling function of the sheet 11 increases.

The peripheral portion 14a of the thermal diffusion layer 14 is exposed. Therefore, heat can easily diffuse from the peripheral portion 14a.

The thickness of the thermal diffusion layer 14 is set to 10 μm to 150 μm, and thus, the cooling function of the sheet 11 can be increased sufficiently.

Second Embodiment

Next, a sheet 11 according to a second embodiment in accordance with the present invention is described with reference to the drawings. In the second embodiment, the same symbols are attached to members which are the same as in the first embodiment, and the descriptions thereof are omitted, and descriptions for operational effects that are the same as in the first embodiment are also omitted.

As shown in FIGS. 4A to 4C, the sheet 11 according to the present embodiment comprises a polymer layer 12, an adhesive layer 13 and a conductive layer 17, which is a functional layer formed on top of the adhesive layer 13. The layers are in the order of: conductive layer 17, adhesive layer 13, polymer layer 12, from the bottom. The sheet 11 is inserted between a heat emitting body and a heat discharging body, for example, for use, and accelerates heat conduction from the heat emitting body to the heat discharging body.

The sheet 11 has high thermal conductivity and a high conductivity, and is easy to handle. The thermal conductivity is an indicator for ease of thermal conductance from the heat emitting body 22 to the heat discharging body 25, and depends mainly on the thermal conductivity and the thermal resistivity of the polymer layer 12, as well as the adhesion between the heat discharging body 25 and the polymer layer 12, as well as that between the conductive layer 17 and the polymer layer 12. The higher the thermal conductivity of the polymer layer 12 is, the smaller the value of the thermal resistance is, and the higher the adhesion between the heat discharging body 25 and the polymer layer 12, as well as that between the conductive layer 17 and the polymer layer 12, is, the higher thermal conductivity the sheet 11 has. The conductivity is an index for the ease with which a current flows from the heat emitting body 22 to the heat discharging body 25 having a high conductivity, and mainly depends on the material for the conductive layer 17. The ease of handling is an indicator for the ease of handling when the sheet 11 is carried, and mainly depends on the adhesiveness of the polymer layer 12. The sheet 11 becomes easier to handle when carried as the adhesiveness of the polymer layer 12 becomes smaller.

The conductive layer 17 allows a current to flow from the heat emitting body 22 to the heat discharging body 25 having a high conductivity, and thus, prevents electrostatic discharge (ESD) due to charging of the heat emitting body 22. The conductive layer 17 is formed of a sheet having a high conductivity, for example a sheet made of a metal, and a conductive resin sheet or a conductive sheet. Specific examples of the material for the sheet made of a metal include copper and aluminum. The conductive resin sheet is provided with, for example, a thermoplastic resin or a thermosetting resin and conductive particles dispersed therein. The conductive sheet is formed by coating the thermoplastic resin sheet, for example, with a metal layer.

As shown in FIGS. 4A and 4B, the outer shape of the conductive layer 17 is in quadrilateral plate form and is larger than the outer shape of the polymer layer 12, and the peripheral portion 17a of the conductive layer 17 is exposed. The thickness of the conductive layer 17 is preferably 20 μm or less, more preferably 2 μm to 14 μm. In the case where the thickness of the conductive layer 17 exceeds 20 μm, there is a risk that the efficiency of thermal conduction from the heat emitting body 22 to the heat discharging body 25 may decrease, due to the excessive thickness of the conductive layer 17. In the case where the thickness of the conductive layer is less than 2 μm, the strength of the conductive layer 17 is low, and therefore, there is a risk that the conductive layer 17 may be broken when the sheet 11 is used (when compressed).

The sheet 11 is manufactured through the preparation step of preparing a composition, the orientation step of orienting the filler in fiber form 16a, the formation step of forming a polymer layer 12, the exposure step of exposing the filler in fiber form 16a, and the laminating step of laminating an adhesive layer 13 and a conductive layer 17 on the polymer layer 12 in this order. In the laminating step, the conductive layer 17 is layered on the adhesive layer 13 after the adhesive layer 13 is layered on the outer surface 12a of the polymer layer 12.

When the sheet 11 is attached to the heat emitting body 22 and the heat discharging body 25, as shown in FIG. 5, the sheet 11 is mounted on the heat emitting body 22 (for example an electric device) provided on a substrate 21, for example. At this time, the conductive layer 17 faces the heat emitting body 22. Subsequently, the heat discharging body 25 having a high conductivity is mounted on the sheet 11, and after that, a load is applied from the heat discharging body 25 to the heat emitting body 22 so that the sheet 11 makes contact with the heat emitting body 22 and the heat discharging body 25, and thus, the sheet 11 is sandwiched between the heat emitting body 22 and the heat discharging body 25. In addition, the peripheral portion 17a of the conductive layer 17 makes contact with the heat discharging body 25.

The above described embodiment has the following advantages.

The sheet 11 according to the present embodiment comprises a polymer layer 12 and a conductive layer 17, which is layered on top of the polymer layer 12 via the adhesive layer 13. Therefore, the sheet 11 accelerates heat conduction from the heat emitting body 22 to the heat discharging body 25 through the polymer layer 12, and thus, excellent thermal conductivity can be gained, and the conductive layer 17 can prevent a problem from arising with the heat emitting body 22 due to ESD.

The thickness of the conductive layer 17 is set to 20 μm or less, and thus, the thermal conductivity of the sheet 11 can be prevented from decreasing due to the conductive layer 17, of which the thermal conductivity is lower than that of the polymer layer 12.

The peripheral portion 17a of the conductive layer 17 is exposed. Therefore, the conductive layer 17 can be easily made to make contact with the heat discharging body 25 when the sheet 11 is attached to the heat emitting body 22 and the heat discharging body 25.

Third Embodiment

Next, a sheet 11 according to a third embodiment in accordance with the present invention is described with reference to the drawings. In the third embodiment, the same symbols are attached to members which are the same as in the first embodiment, and the descriptions thereof are omitted, and descriptions for operational effects that are the same as in the first embodiment are also omitted.

Figure 6A:
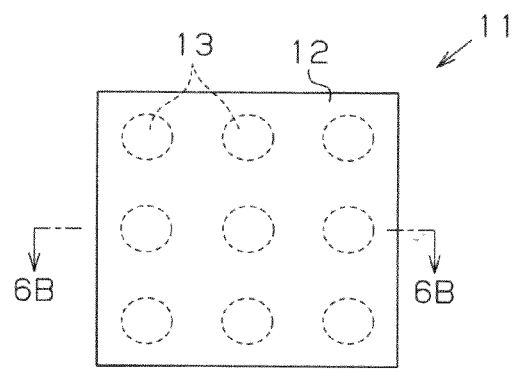
FIG. 6A is a cross sectional diagram showing the thermally conductive sheet according to a third embodiment.
Figure 6C:
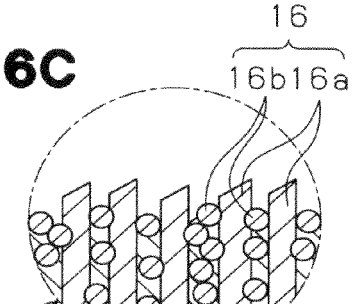
FIG. 6C is an enlarged cross sectional diagram showing a polymer layer.
Figure 6B:
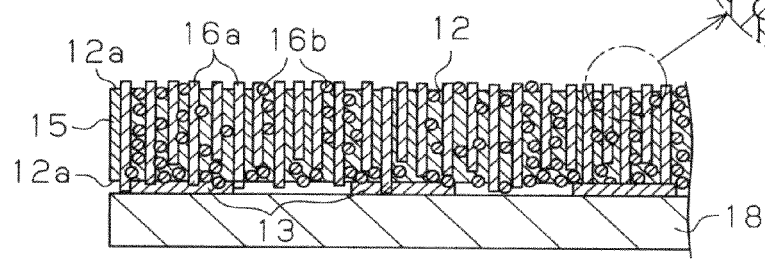
FIG. 6B is a cross sectional diagram along line 6B-6B of FIG. 6A.

As shown in FIGS. 6A to 6C, the sheet 11 according to the present embodiment comprises a polymer layer 12, an adhesive layer 13, and an electrically insulating film 18, which is a functional layer formed on the adhesive layer 13. The layers are in the order of: electrically insulating layer 18, adhesive layer 13, polymer layer 12, from the bottom. The sheet 11 is inserted between a heat emitting body 22 and a heat discharging body 25, for example, for use, and accelerates heat conduction from the heat emitting body 22 to the heat discharging body 25.

The sheet 11 has a high thermal conductivity and high electrical insulation, and is easy to handle. The thermal conductivity is an indicator for the ease of thermal conductance from the heat emitting body 22 to the heat discharging body 25, and mainly on the basis of the thermal conductivity and the thermal resistivity of the polymer layer 12, and the adhesion between the heat discharging body 25 and the polymer layer 12, as well as that between the electrically insulating layer 18 and the polymer layer 12. The higher the thermal conductivity of the polymer layer 12 is, the smaller the value of the thermal resistance is, and the higher the adhesion between the heat discharging body 25 and the polymer layer 12, as well as that between the electrically insulating layer 18 and the polymer layer 12, is, the more excellent thermal conductivity the sheet 11 has. The electrical insulation is an indicator for the ease with which the flow of a current from the heat emitting body is blocked, and mainly on the basis of the material for the electrically insulating layer 18. The case of handling is an indicator for the case of handling when the sheet 11 is carried, and mainly depends on the adhesiveness of the polymer layer 12. The lower the adhesiveness of the polymer layer 12 is, the easier the sheet 11 is to handle when carried, and thus, the sheet 11 is easy to handle.

The electrically insulating layer 18 is located between the heat emitting body 22 and the polymer layer 12, and blocks the flow of a current from the heat emitting body 22 to the polymer layer 12 when the sheet 11 is attached to a heat emitting body 22, for example. Specific examples of the material for the electrically insulating layer 18 include thermoplastic resins, thermosetting resins and mixtures of these. Specific examples of thermoplastic resins include polyethylene based resins, polypropylene based resins, polyacrylate based resins, polystyrene based resins, polyester based resins and polyurethane based resins. Specific examples of thermosetting resins include silicone based resins, phenol based resins, epoxy based resins, melamine based resins and polyurethane based resins.

The outer shape of the electrically insulating layer 18 has the same size as the outer shape of the polymer layer 12. The thickness of the electrically insulating layer is preferably 12 µm or less, more preferably 2 µm to 12 µm. In the case where the thickness of the electrically insulating layer 18 exceeds 12 µm, there is a risk that the efficiency of thermal conduction from the heat emitting body 22 to the heat discharging body 25 may decrease, due to the excessive thickness of the electrically insulating layer 18. In the case where the thickness of the electrically insulating layer 18 is less than 2 µm, the strength of the electrically insulating layer 18 is low, and there is a risk that the electrically insulating layer 18 may be damaged when the sheet 11 is used (when compressed).

The sheet 11 is manufactured through the preparation step of preparing a composition, the orientation step of orienting the filler in fiber form 16a in one direction, the formation step of forming a polymer layer 12, the exposure step of exposing the filler in fiber form 16a and the laminating step of laminating an adhesive layer 13 and an electrically insulating layer 18 on the polymer layer 12 in this order. In the laminating step, an adhesive layer 13 is layered on top of the outer surface 12a of the polymer layer 12, and after that, the electrically insulating layer 18 is layered on top of the adhesive layer 13.

When the sheet 11 is attached to the heat emitting body 22 and the heat discharging body 25, the sheet 11 is placed on top of the heat emitting body 22 (for example an electronic device) provided on a substrate 21, for example. At this time, the electrically insulating layer 18 faces the heat emitting body 22. Subsequently, the heat discharging body 25 is mounted on the sheet 11, and after that, a load is applied toward the heat emitting body 22 from the heat discharging body 25 so that the sheet 11 makes close contact with the heat emitting body 22 and the heat discharging body 25, and thus, the sheet 11 is sandwiched between the heat emitting body 22 and the heat discharging body 25.

The above described embodiment has the following advantages.

The sheet 11 according to the present embodiment comprises a polymer layer 12 and an electrically insulating layer 18 layered on top of the polymer layer 12 via an adhesive layer 13. Therefore, the sheet 11 accelerates thermal conduction from the heat emitting body 22 to the heat discharging body 25 through the polymer layer 12, and thus, can provide excellent conductivity.

In the case where the polymer layer 12 contains a thermally conductive filler 16 having electrical conductance, there is a risk that a current may flow from the heat emitting body 22 to the thermally conductive filler 16 in the polymer layer 12, causing short-circuiting, depending on the thermally conductive filler 16 content when the sheet 11 attached to the heat emitting body 22 does not have an electrically insulating layer 18. In contrast, according to the present embodiment, the electrically insulating layer 18 blocks the flow of a current from the heat emitting body 22 to the polymer layer 12, and thus, the heat emitting body 22 can be prevented from short-circuiting.

The thickness of the electrically insulating layer 18 is set to 12 µm or less, and thus, the thermal conductivity of the sheet 11 can be prevented from becoming low due to the electrically insulating layer 18, of which the thermal conductivity is low in comparison with the polymer layer 12.

Fourth Embodiment

Next, a sheet 11 according to a fourth embodiment in accordance with the present invention is described with reference to the drawings. In the fourth embodiment, the same symbols are attached to members that are the same as in the first and second embodiments, and the descriptions thereof are omitted, and descriptions for operational effects that are the same as in the first and second embodiments are also omitted.

Figure 7A:
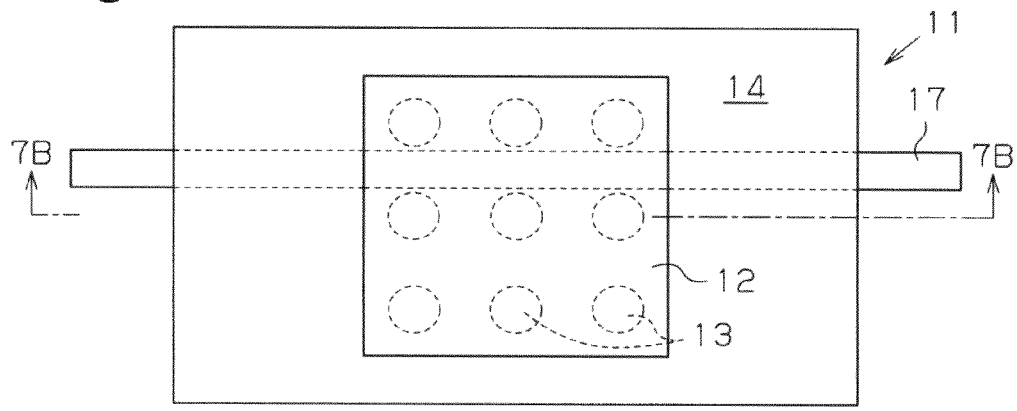
FIG. 7A is a plane diagram showing the thermally conductive sheet according to the fourth embodiment.
Figure 7B:
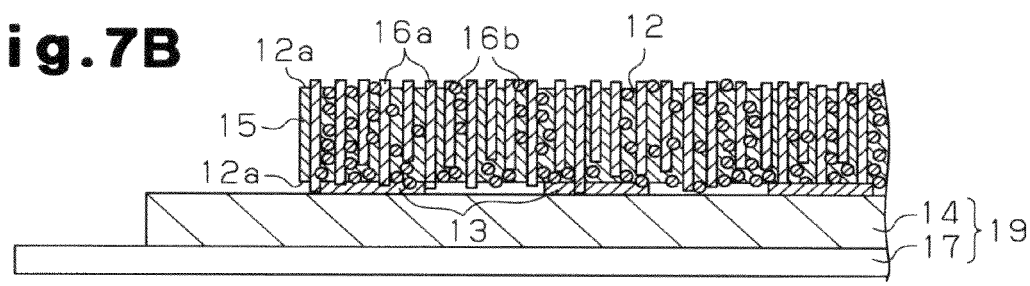
FIG. 7B is a cross sectional diagram along line 7B-7B of FIG. 7A.

As shown in FIGS. 7A and 7B, the sheet 11 according to the present embodiment is provided with a polymer layer 12, an adhesive layer 13 and a functional layer 19 formed on the adhesive layer 13. The functional layer 19 according to the present embodiment is formed of two layers, that is, a thermal diffusion layer 14 formed on the adhesive layer 13 and a conductive layer 17 formed on the thermal diffusion layer 14. The layers are in the order of: conductive layer 17, thermal diffusion layer 14, adhesive layer 13, polymer layer 12, from the bottom. The sheet 11 is inserted between a heat emitting body 22 and a heat discharging body 25, for example, for use, and accelerates thermal conduction from the heat emitting body 22 to the heat discharging body 25.

The sheet 11 has a cooling function and electrical conductance, and is easy to handle. The cooling function is an indicator for the ease with which the hot heat emitting body 22 is cooled, and based on the thermal conductivity of the polymer layer 12 and the properties of the thermal diffusion layer 14 in terms of thermal diffusion. That is to say, the cooling function is based on the thermal conductivity of the polymer layer 12, the value of the thermal resistance of the polymer layer 12, the adhesion between the heat discharging body 25 and the polymer layer 12, as well as that between the thermal diffusion layer 14 and the polymer layer 12, and the properties of the thermal diffusion layer 14 in terms of thermal diffusion. The higher the thermal conductivity of the polymer layer 12 is, the smaller the value of the thermal resistance of the polymer layer 12 is, the higher the adhesion between the heat emitting body 25 and the polymer layer 12, as well as that between the thermal diffusion layer 14 and the polymer layer 12 is, and the more excellent the properties of the thermal diffusion layer 14 in terms of thermal diffusion are, the more excellent cooling function the sheet 11 has.

The electrical conductance is an indicator for the ease with which a current flows from the heat emitting body 22 to the heat discharging body 25 having electrical conductance, and mainly based on the material of the conductive layer 17. The ease of handling is an indicator for the ease with which the sheet 11 can be handled when carried, and mainly based on the adhesiveness of the polymer layer 12. The lower the adhesiveness of the polymer layer 12, the easier the sheet 11 is to be handled when carried, and higher the handling ability of the sheet 11. The conductive layer 17 according to the present embodiment is formed in band form, and the two end portions of the conductive layer 17 are exposed from the thermal diffusion layer 14.

The sheet 11 is manufactured through the preparation step of preparing a composition, the orientation step of orienting the filler in fiber form 16a in one direction, the formation step of forming the polymer layer 12, the exposure step of exposing the filler in fiber form 16a and the laminating step of laminating the adhesive layer 13, the thermal diffusion layer 14 and the conductive layer 17 on the polymer layer 12 in this order. In the laminating step, the adhesive layer 13 is layered on top of the outer surface 12a of the polymer layer 12, and after that, the thermal diffusion layer 14 and the conductive layer 17 are layered on the adhesive layer 13 in this order.

When the sheet 11 is attached to the heat emitting body 22 and the heat discharging body 25, the sheet 11 is mounted on the heat emitting body 22 (for example an electronic device) provided on the substrate 21, for example. At this time, the conductive layer 17 faces the heat emitting body 22. Subsequently, the heat discharging body 25 having electrical conductance is mounted on the sheet 11, and after that, a load is applied toward the heat emitting body 22 from the heat discharging body 25 so that the sheet 11 makes close contact with the heat emitting body 22 and the heat discharging body 25, and thus, the sheet 11 is sandwiched between the heat emitting body 22 and the heat discharging body 25. In addition, the two end portions of the conductive layer 17 are made to make contact with the heat discharging body 25.

The above described embodiment has the following advantages.

The sheet 11 according to the present embodiment comprises the polymer layer 12, the thermal diffusion layer 14 layered on top of the polymer layer 12 via the adhesive layer 13, and the conductive layer 17. Therefore, the sheet 11 allows heat from the heat emitting body 22 to diffuse through the thermal diffusion layer 14 and accelerates thermal conductance from the heat emitting body 22 to the heat discharging body 25 through the polymer layer 12, and thus, can provide an excellent cooling function. Furthermore, the sheet 11 can allow the conductive layer 17 to prevent a problem from arising with the heat emitting body 22 due to ESD.

The two end portions of the conductive layer 17 are exposed. Therefore, the conductive layer 17 can be easily made to make contact with the heat discharging body 25 when the sheet 11 is attached to the heat emitting body 22 and the heat discharging body 25.

It should be apparent to those skilled in the art that the present invention may be embodied in many other specific forms without departing from the spirit or scope of the invention. Particularly, it should be understood that the invention may be embodied in the following forms.

In the respective embodiments, the form of the polymer layer 12, the thermal diffusion layer 14, the conductive layer 17 and the electrically insulating layer 18 is not particularly limited, and these may be in a form other than quadrilateral plate form, for example, in disc form.

Figure 8A:
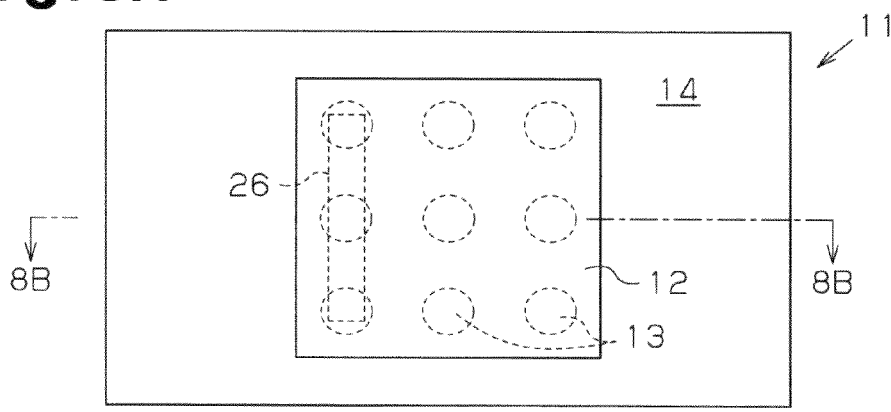
FIG. 8A is a plane diagram showing another example of the thermally conductive sheet.
Figure 8B:
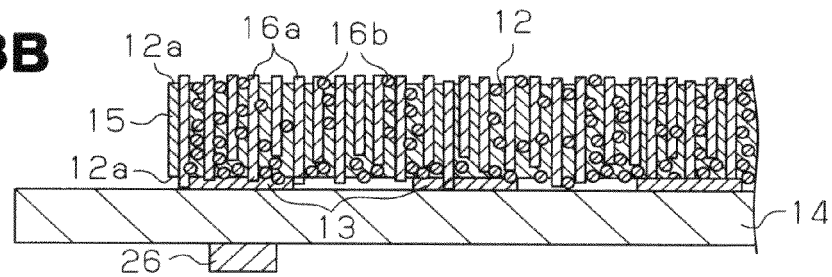
FIG. 8B is a cross sectional diagram along line 8B-8B of FIG. 8A.

In the respective embodiments, a viscous layer may be formed on the outer surface of a layer which is located on the outside, from among the layers forming the sheet 11. As shown in FIGS. 8A and 8B, for example, in the first embodiment, a viscous layer 26 in band form may be formed on the outer surface which does not face the adhesive layer 13, between the pair of outer surfaces of the thermal diffusion layer 14. Specific examples of the material for the viscous layer 26 include the above described gluing agents. In this case, the viscous layer 26 is made to face the heat emitting body 22 while positioning the sheet 11 when the sheet 11 is attached to the heat emitting body 22, for example. Then, the portion of the polymer layer 12 which corresponds to the viscous layer 26 is pressed toward the heat emitting body 22 with the fingertips, for example. At this time, the viscous layer 26 becomes pasted to the heat emitting body 22, due to its viscosity, and shifting of the sheet position can be prevented. Therefore, the sheet can be easily attached to the heat emitting body 22.

In the respective embodiments, the outer shape of the adhesive layer 13 may be smaller than the outer shape of the polymer layer 12, and formed on only a portion of the polymer layer 12, and thus, be in a form other than multi-dot form. As shown in FIGS. 9B and 9C, for example, the adhesive layer 13 in quadrilateral plate form may be formed in the four corners of the polymer layer 12, or as shown in FIG. 9D, the adhesive layer 13 in quadrilateral plate form may be formed in the center portion of the polymer layer 12. As shown in FIGS. 9E and 9F, the intervals between the pieces in the adhesive layer 13 may be changed appropriately. As shown in FIG. 9G, an adhesive layer 13 in disc form may be formed in the four corners of the polymer layer 12, or as shown in FIG. 9H, the adhesive layer 13 in band form may be formed in a peripheral portion of the polymer layer 12. In addition, as shown in FIGS. 9I and 9J, the width of the adhesive layer 13 in square annular form may be changed appropriately.

Though the adhesive layer 13 may be formed in the center portion of the polymer layer 12, it is preferable for it to be formed in the peripheral portion of the polymer layer 12, and it is more preferable for it to be formed in annular form in the entire peripheral portion of the polymer layer 12. The amount of heat emitted from the center portion of the heat emitting body 22 is usually greater than the amount of heat emitted from the peripheral portion of the heat emitting body 22, and therefore, the temperature of the center portion of the heat emitting body 22 is high in comparison with the peripheral portion. In the case where the adhesive layer 13 is formed in the peripheral portion of the polymer layer 12, the value of the thermal contact resistance in the peripheral portion of the polymer layer 12 attached to the heat emitting body 22 becomes high in comparison with the value of the thermal contact resistance in the center portion of the polymer layer 12. Therefore, the center portion of the polymer layer 12, of which the value of the thermal contact resistance is low in comparison with the peripheral portion, corresponds to the center portion of the heat emitting body 22, of which the temperature is high in comparison with the peripheral portion, and thus, the thermal conductivity of the sheet 11 can be increased in comparison with the case where the adhesive layer 13 is formed in the center portion of the polymer layer 12. Furthermore, the adhesive layer 13 is formed in annular form in the entire peripheral portion of the polymer layer 12, and thus, the thin and flexible polymer layer 12 can be prevented from bending, as in the case where the adhesive layer 13 is formed in multi-dot form.

The peripheral portion of the polymer layer 12 is a region between the peripheral of the polymer layer 12 and ⅗ of the distance from the peripheral of the polymer layer 12 to the center. In the polymer layer 12 in quadrilateral plate form having sides of 40 mm, for example, the peripheral portion of the polymer layer 12 is in quadrilateral annular form with a width of 24 mm. In addition, in the polymer layer 12 in disc form having a radius of 20 mm, the peripheral portion of the polymer layer 12 is in annular form with a width of 12 mm.

In the respective embodiments, the end portions of the filler in fiber form 16a may not be exposed from the outer surfaces 12a of the polymer layer 12. In addition, the filler in fiber form 16a may not be oriented in one direction.

In the respective embodiments, the sheet 11 may further comprise the functional layer of another embodiment. That is to say, the functional layer that forms the sheet 11 may have a number of layers having different working effects. In this case, a number of layers that form the functional layer may be formed only on one outer surface 12a of the pair of outer surfaces 12a of the polymer layer 12, or the adhesive layer 13 may be formed on each outer surface 12a of the polymer layer 12, so that the adhesive layers are independently formed on the respective outer surfaces 12a of the polymer layer 12. In the case where the functional layer is formed of a number of layers, it is preferable for each layer to be thin, in order to prevent the value of the thermal contact resistance of the sheet from becoming high due to the thickness of the functional layer.

In the respective embodiments, the heat discharging body 25 may be omitted. In this case, the peripheral portion 17a of the conductive layer 17 is connected to a member having electrical conductance, for example the housing, in the second embodiment. In this configuration also, heat can be released from the surface of the polymer layer 12.

In the first embodiment, the outer shape of the thermal diffusion layer 14 may be the same as the outer shape of the polymer layer 12, or smaller than the outer shape of the polymer layer 12.

In the first embodiment, the sheet 11 may be placed on the heat emitting body 22 in such a manner that the polymer layer 12 faces the heat emitting body 22 when the sheet 11 is attached to the heat emitting body 22, for example.

In the second embodiment, the heat discharging body 25 may not have electrical conductance. In this case, the peripheral portion 17a of the conductive layer 17 is connected to a member having electrical conductance, for example the housing.

The above embodiments are described more specifically by way of Examples and Comparative Examples below.

EXAMPLES OF FIRST EMBODIMENT

Example 1-a

In Example 1-a, in the preparation step, carbon fibers, which are the filler in fiber form 16a, and alumina (aluminum oxide) in spherical form, which is the filler in particle form 16b, were mixed into addition type liquid silicone (hereinafter referred to as liquid silicone gel), which is the polymer matrix 15, so that a composition was prepared. The liquid silicone gel solidified into a gel form after hardening. Table 1 shows the amount of each component mixed in. The unit for the blending quantity of each component in is mass parts. The viscosity of the liquid silicone gel at 25° C. was 400 mPa·s, and the specific weight of the liquid silicone gel was 1.0. The average fiber diameter of the carbon fibers was 10 μm, and the average fiber length of the carbon fibers was 160 μm. The average particle diameter of the alumina in spherical form was 3.2 μm. Next, the composition was stirred until the carbon fibers and alumina in spherical form were uniformly dispersed, and after that, bubbles were removed from the composition.

Subsequently, in the orientation step, the viscosity of the composition at 25° C. was measured using a rotation viscometer, and after that, the die was filled with the composition. Table 1 shows the results of measurement for the viscosity. Next, a superconductive magnet was used to apply a magnetic field having a magnetic flux density of 100,000 Gauss to the composition, and at the same time, compressed air was used to apply vibration with a frequency of 3.0 Hz and amplitude of 10 mm to the composition via the die, and thus, the carbon fibers were oriented in the direction of the thickness of the polymer layer.

Next, in the formation step, the composition was heated at 120° C. for 90 minutes so that the liquid silicone gel hardened and the polymer layer 12 was obtained. Then, in the exposure step, a rotational cutter was used to remove a hardened silicone having a thickness of 5 μm from the paired outer surfaces 12a of the polymer layer 12, and thus, the carbon fibers were exposed. The thickness of the polymer layer 12 was 0.3 mm after the exposure step. When the outer surfaces 12a of the polymer layer 12 were observed through an electronic microscope after the exposure step, it was confirmed that the carbon fibers were exposed. The thus gained polymer layer 12 was cut into quadrilateral plate form (with sides having a length of 40 mm).

Figure 9A:
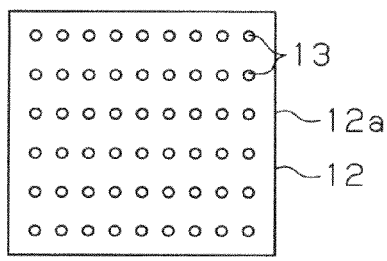
FIGS. 9A to 9J are plane diagrams showing an adhesive layer and other examples thereof in accordance with examples of the invention.
Figure 9B:
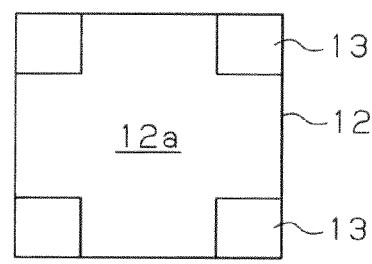
Figure 9C:
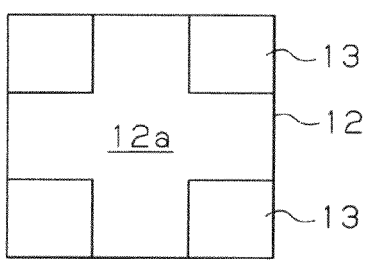
Figure 9D:
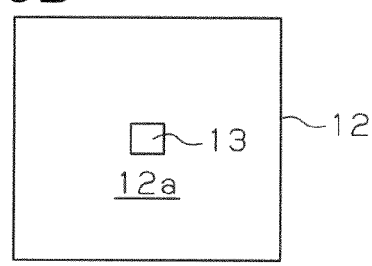
Figure 9E:
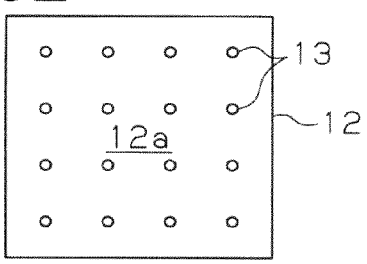
Figure 9F:
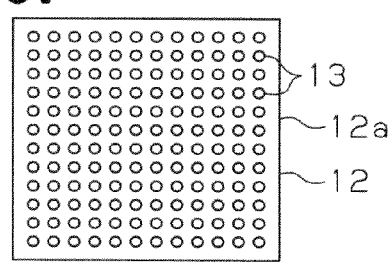
Figure 9G:
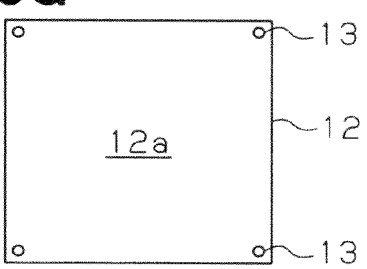
Figure 9H:
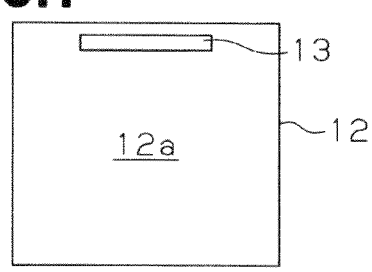
Figure 9I:
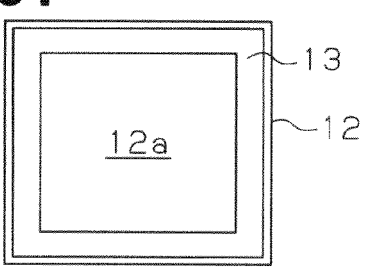
Figure 9J:
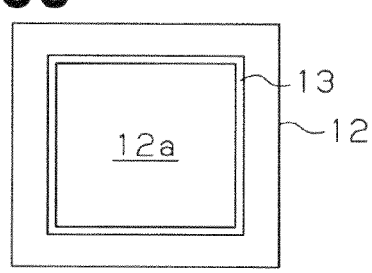

Subsequently, in the laminating step, as shown in FIG. 9A, a silicone based adhesive was applied over the entirety of the outer surfaces 12a of the polymer layer 12 in multi-dot form, and thus, the adhesive layer 13 in multi-dot form (thickness: 30 μm, diameter of each dot: 1.5 mm, interval between each dot: 7 mm) was formed. Next, the thermal diffusion layer 14 made of a graphite sheet (thickness: 130 μm, made by GrafTech International Ltd.) was layered on top of the polymer layer 12 via the adhesive layer 13, so that the sheet 11 was gained.

Example 1-b

As shown in Table 2, the sheet 11 was obtained in the same manner as in Example 1-a, except that the thickness of the adhesive layer 13 was changed to 50 μm.

Example 1-c

As shown in Table 2, the sheet 11 was obtained in the same manner as in Example 1-a, except that the thickness of the adhesive layer 13 was changed to 60 μm.

Example 1-d

As shown in FIG. 9B and Table 2, the sheet 11 was obtained in the same manner as in Example 1-a, except that an adhesive layer 13 (thickness: 30 μm, length of sides: 10 mm) was formed in the four corners of the polymer layer 12.

Example 1-e

As shown in FIG. 9C and Table 2, the sheet 11 was obtained in the same manner as in Example 1-a, except that the adhesive layer 13 (thickness: 30 μm, length of sides: 12 mm) was formed in the four corners of the polymer layer 12.

Example 1-f

As shown in FIG. 9D and Table 2, the sheet 11 was obtained in the same manner as in Example 1-a, except that the adhesive layer 13 (thickness: 30 μm, length of sides: 5 mm) was formed in the four corners of the polymer layer 12.

Examples 2-a to 2-f

In Examples 2-a to 2-f, PBO carbon fibers were used as a filler in fiber form, and at the same time, the amount of each component mixed in was changed as shown in Table 1, and furthermore, the silicone was removed in the exposure step, through polishing using a mesh made of metal. For the rest, the polymer layer 12 was gained in the same manner as in Examples 1-a to 1-f. When the outer surfaces 12a of the polymer layer 12 were observed through an electron microscope after the exposure step, it was confirmed that the PBO carbon fibers were exposed. The thus gained polymer layer 12 was cut into quadrilateral plate form (length of sides: 40 mm). Then, as shown in Table 3, in the same manner as in Examples 1-a to 1-f, the adhesive layer 13 was formed and the thermal diffusion layer 14 was layered on top of this, and thus, the sheet 11 was obtained.

The alphabetical letters in Examples 2-a to 2-f indicate points which correspond to Examples 1-a to 1-f. For example, in Example 2-a, the adhesive layer 13 was formed in the same manner as in Example 1-a, and in Example 2-b, the adhesive layer 13 was formed in the same manner as in Example 1-b.

Examples 3-a to 3-d

In Example 3-a, as shown in Table 4, the sheet 11 was gained in the same manner as in Example 1-a. In Example 3-b, as shown in Table 4, the sheet 11 was obtained in the same manner as in Example 3-a, except that the thickness of the thermal diffusion layer 14 was changed to 80 μm. In Example 3-c, the sheet 11 was obtained in the same manner as in Example 3-a except that the thickness of the thermal diffusion layer 14 was changed to 250 μm. In Example 3-d, the sheet 11 was gained in the same manner as in Example 3-a, except that the thickness of the thermal diffusion layer 14 was changed to 375 μm.

Comparative Examples 1-a to 2-b

In Comparative Example 1-a, a sheet was gained in the same manner as in Example 1-a, except that there was no adhesive layer 13 and thermal diffusion layer 14. In Comparative Example 1-b, a sheet was obtained in the same manner as in Example 1-a, except that the adhesive layer 13 was formed throughout the entirety of the outer surface 12a of the polymer layer 12. In Comparative Example 2-a, a sheet was obtained in the same manner as in Example 2-a, except that there was no adhesive layer 13 and thermal diffusion layer 14. In Comparative Example 2-b, a sheet was obtained in the same manner as in Example 2-a, except that the adhesive layer 13 was formed throughout the entirety of the outer surface 12a of the polymer layer 12.

Then, the polymer layer 12 and the sheet in each example were measured and evaluated in terms of each of the following items. The results are shown in Tables 1 to 4. The numeral values in the column "ratio (%) (relative to outer surface)" in Tables 2 to 4 indicate the ratio of the area occupied by the adhesive layer 13 to the area of the entirety of one outer surface 12a of the polymer layer 12 to which the adhesive layer 13 is attached.

Ease of Handling

The ease of handling was evaluated on the basis of the adhesiveness of the polymer layer 12 in each example. In the column "ease of handling" in Table 1, "o" indicates that the adhesiveness of the polymer layer 12 was appropriately low and the polymer layer 12 was easy to handle.

Thermal Conductivity

Test pieces in disc form (diameter: 10 mm, thickness: 0.3 mm) were obtained from the polymer layer 12 in each example, and after that, the thermal conductivity of the test pieces was measured in accordance with a laser flash method.

Value of Thermal Resistance

Figure 10:
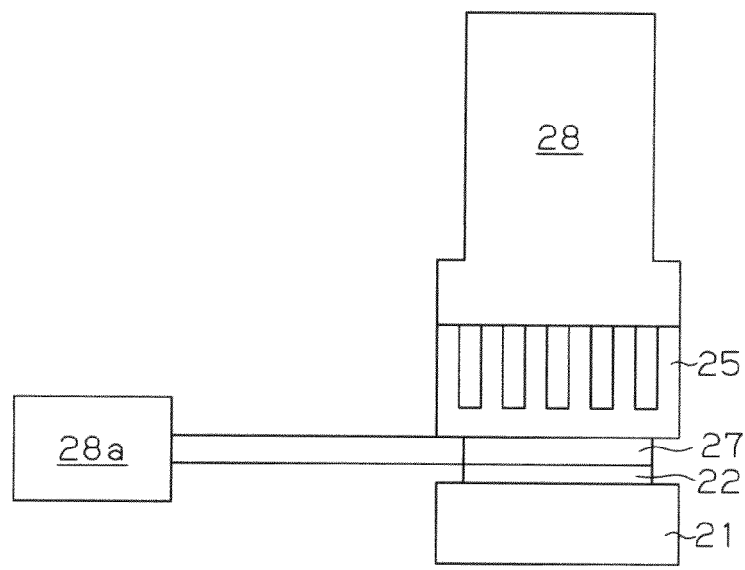
FIG. 10 is a schematic diagram illustrating a method for measuring the value of the thermal resistance in the polymer layer.

As shown in FIG. 10, the test piece 27 made of the sheet in each example or comparative example and the heat discharging body 25 made of a metal were mounted on top of the heat emitting body 22 formed on a substrate 21 in this order, and a weight 28 of 10 kg was placed on the heat discharging body 25, so that a load of $6.1 \times 10^4$ Pa was applied to the test piece 27. Then, this was left for 10 minutes in such a state that the heat emitting body 22 was emitting heat, and after that, the temperature $T_1$ of the outer surface on the heat emitting body 22 side and the temperature $T_2$ of the outer surface on the heat discharging body 25 side in the test piece 27 were measured using the measuring machine 28a. Then, the value of the thermal resistance of the test piece 27 was calculated using the following formula (1). The heat emitting body 22 is usually an electronic part, such as a CPU, and a heater of which the amount of heat emitted is 100 W was used as the heat emitting body 22 in the present test, in order to simplify and expedite the evaluation of the performance of the sheet. The value of the above described load indicates the size of the load usually applied to the sheet when the sheet is attached to an electronic part.

$$\text{Value of thermal resistance (° C./}W\text{)}=(T_1(° C.)-T_2(° C.))/\text{amount of heat emitted }(W) \quad (1)$$

Coefficient of Static Friction

Figure 11:
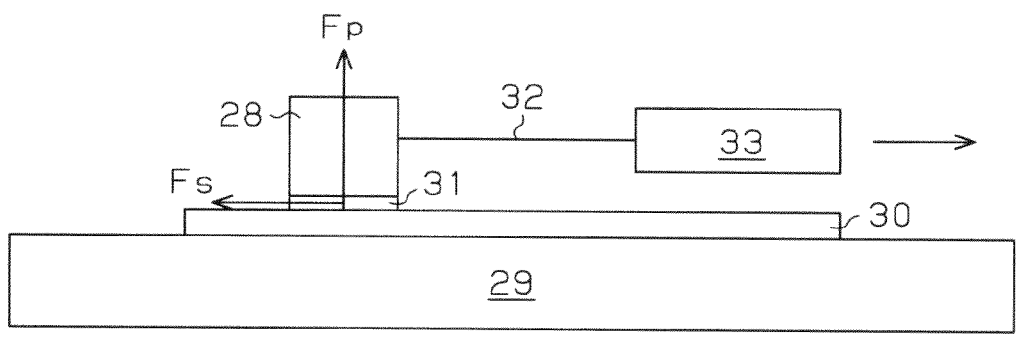
FIG. 11 is a schematic diagram illustrating a method for measuring the coefficient of static friction in the polymer layer.

As shown in FIG. 11, a test piece 30 made of the polymer layer in each example was placed on the horizontal table 29, and after that, the sliding piece 31 and the weight 28 of 120 g (columnar form, with a diameter of 28 mm and height of 25 mm) were placed on this test piece 30 in this order. Next, one end of the tape 32 for pulling was pasted to the weight 28 and the other end of the tape 32 was fixed to the push-pull gauge 33 (CPU gauge M-9500, made by Aikoh Engineering Co., Ltd.). Subsequently, as shown by the arrow in FIG. 11, the push-pull gauge 33 was pulled in the direction parallel to the outer surface of the test piece 30 at a speed of 100 mm/min. Next, the static frictional force Fs (N) between the test piece and the sliding piece 31 when the push-pull gauge 33 is pulled was measured.

Then, the coefficient of static friction was calculated using the following formula (2). Here, the measurement of the static frictional force Fs and the calculation of the coefficient of static friction were repeated five times for the polymer layer 12 in each example and comparative example, and the average value for these values of the coefficient of static friction was taken to be the coefficient of static friction of the polymer layer 12. In addition, two types of sliding pieces 31: a PET film (Lumirror S10, made by Toray Industries Inc., thickness: 75 μm) and an aluminum foil tape (Scotch Brand Tape 433 HD, made by Sumitomo 3M Limited) were used. In terms of the aluminum foil tape, the aluminum foil tape was placed on the test piece 30 so that the aluminum foil surface of the tape faced the test piece 30.

$$\text{Coefficient of static friction}=Fs(N)/Fp(N) \quad (2)$$

In the above described formula (2), Fp indicates a vertical reaction caused by the mass (mass) of the sliding piece 31, and the value of Fp can be represented by 0.12 kg (mass of weight 28)×9.8 m/s² (gravitational acceleration)=0.1176 N.

Adhesiveness

Figure 12:
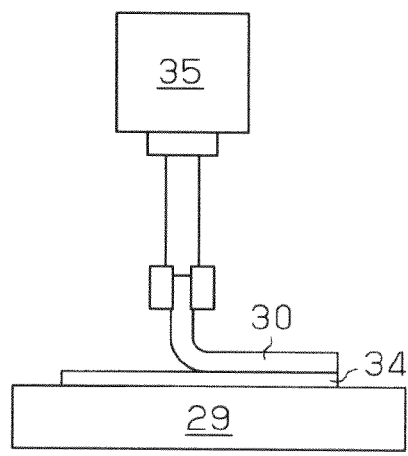
FIG. 12 is a schematic diagram illustrating a method for measuring the adhesiveness of the polymer layer.

The adhesiveness of the polymer layer 12 in each example and comparative example was measured in accordance with JIS Z 0237. Concretely, as shown in FIG. 12, the film 34 was secured to the surface of the horizontal table 29, and after that, the test piece 30 in each example comparative example was placed on top of this. Then, one end of the test piece 30 was fixed to the load cell 35 of the tensile test machine. Then, the load when the test piece 30 is pulled and peeled along a line perpendicular to the horizontal table 29 at a speed of 300 mm/min was measured. Here, the measurement of the load for the test piece in each example comparative example was repeated five times, and the average value of these measured values was taken to be the adhesiveness of the polymer layer 12. As the film 34, two types of film were used: a PET film (Lumirror S10, made by Toray Industries Inc., thickness: 75 µm) and an aluminum foil tape (Scotch Brand Tape 433 HD, made by Sumitomo 3M Limited). In terms of the aluminum, the aluminum foil tape was secured to the horizontal table 29 so that the aluminum foil surface of the tape faced the test piece 30. The column "adhesiveness (for aluminum) (N/25 mm)" in Table 1 indicates the results of measurement for the adhesiveness in the case where the aluminum foil tape was used, while the column "adhesiveness (for PET) (N/25 mm)" indicates the results of measurement for the adhesiveness in the case where the PET film was used. In these columns, "-" indicates that the adhesiveness was too small to be measured in accordance with the above describe method.

Properties in Terms of Thermal Diffusion

Figure 13A:
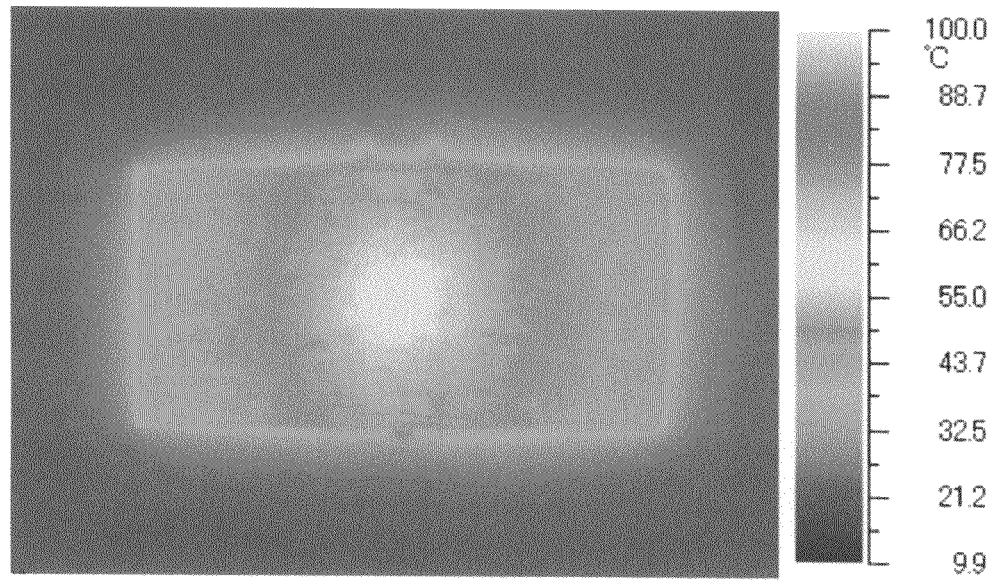
FIG. 13A is a photograph showing the temperature distribution in the test piece according to Example 1-a.
Figure 13B:
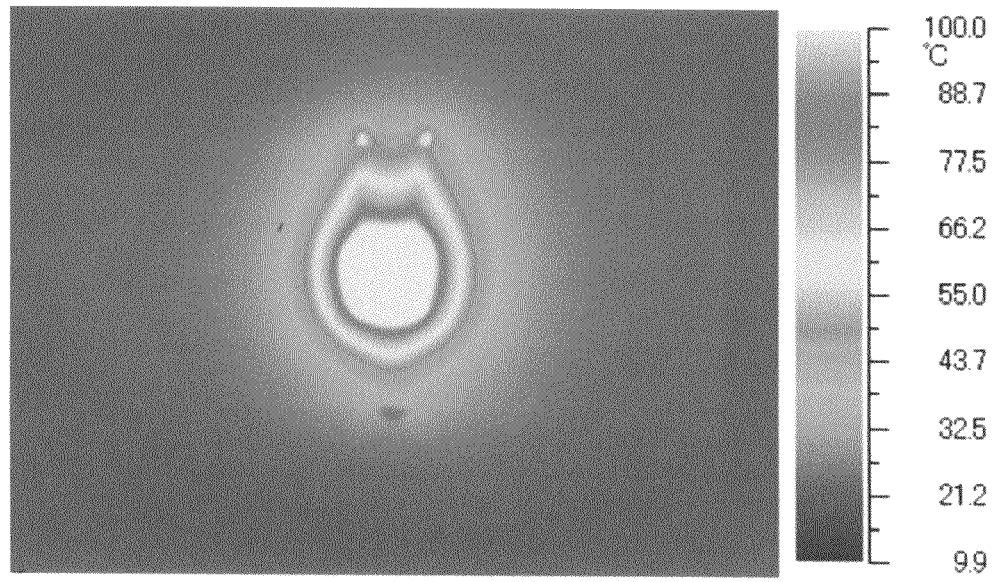
FIG. 13B is a photograph showing the temperature distribution in the test piece according to Comparative Example 1-a.

The test piece 27 made of the sheet in each example comparative example was placed in the center of a ceramic heater (heat source) having sides of 10 mm, so that the polymer layer 12 made contact with the ceramic heater, and after that, the temperature of the test piece 27 was measured using a thermoviewer. The voltage applied to the ceramic heater was set to 10 V. The results are shown in Tables 2 to 4. In the column "properties in terms of thermal diffusion" in Tables 2 to 4, "o" indicates that the heat from the heat source diffused throughout approximately the entirety of the test piece 27, and "x" indicates that the heat from the heat source was concentrated in a portion of the test piece 27. FIG. 13A shows the results of measurement for the temperature of the test piece 27 in Example 1-a, and FIG. 13B shows the results of measurement for the temperature of the test piece 27 in Comparative Example 1-a.

TABLE 1

|  | Examples 1 and 3 | Example 2 |
|---|---|---|
| Liquid silicone (amount mixed in) | 100 | 100 |
| Carbon fibers | 120 | 120 |
| Average fiber length (µm) | 160 | 200 |
| Alumina | 475 | 500 |
| Viscosity (25° C., 1.0 rpm) mPa · s | 600,000 | 1,100,000 |
| Magnetic field | Yes | Yes |
| Vibration | Frequency: 3.0 Hz | Frequency: 3.0 Hz |
|  | Amplitude: 10 mm | Amplitude: 10 mm |
| Exposure step | Yes | Yes |
| Filler in fiber form in crosswise direction (%) | 70 | 70 |
| Ease of handling | ◯ | ◯ |
| Thermal conductivity (W/m · K) | 30 | 50 |
| Coefficient of static friction (for aluminum) | 0.134 | 0.129 |
| Coefficient of static friction (for PET) | 0.170 | 0.166 |
| Adhesiveness (for aluminum) (N/25 mm) | — | — |
| Adhesiveness (for PET) (N/25 mm) | — | — |

TABLE 2

|  | Examples | | | | | | Comparative examples | |
|---|---|---|---|---|---|---|---|---|
|  | 1-a | 1-b | 1-c | 1-d | 1-e | 1-f | 1-a | 1-b |
| Adhesive layer | Yes | Yes | Yes | Yes | Yes | Yes | No | Yes |
| Material | A based | A based | A based | A based | A based | A based | — | A based |
| Thickness (µm) | 30 | 50 | 60 | 30 | 30 | 30 | — | 30 |
| Location | Multi-dot form | Multi-dot form | Multi-dot form | Four corners | Four corners | Center | — | Entire surface |
| Ratio (%) (relative to outer surface) | 4.0 | 4.0 | 4.0 | 25 | 36 | 1.6 | — | 100 |
| Thermal diffusion layer | Yes | Yes | Yes | Yes | Yes | Yes | No | Yes |
| Thickness (µm) | 130 | 130 | 130 | 130 | 130 | 130 | — | 130 |
| Value of thermal resistance (° C./W) | 0.055 | 0.061 | 0.085 | 0.071 | 0.089 | 0.092 | 0.030 | 0.115 |
| Properties in terms of thermal diffusion | ◯ | ◯ | ◯ | ◯ | ◯ | ◯ | X | ◯ |

A based . . . acryl based adhesive

TABLE 3

|  | Examples | | | | | | Comparative examples | |
| --- | --- | --- | --- | --- | --- | --- | --- | --- |
|  | 2-a | 2-b | 2-c | 2-d | 2-e | 2-f | 2-a | 2-b |
| Adhesive layer | Yes | Yes | Yes | Yes | Yes | Yes | No | Yes |
| Material | A based | A based | A based | A based | A based | A based | — | A based |
| Thickness(μm) | 30 | 50 | 60 | 30 | 30 | 30 | — | 30 |
| Location | Multi-dot form | Multi-dot form | Multi-dot form | Four corners | Four corners | Center | — | Entire surface |
| Ratio (%) (relative to outer surface) | 4.0 | 4.0 | 4.0 | 25 | 36 | 1.6 | — | 100 |
| Thermal diffusion layer | Yes | Yes | Yes | Yes | Yes | Yes | No | Yes |
| Thickness(μm) | 130 | 130 | 130 | 130 | 130 | 130 | — | 130 |
| Value of thermal resistance (° C./W) | 0.054 | 0.060 | 0.075 | 0.071 | 0.089 | 0.092 | 0.027 | 0.101 |
| Properties in terms of thermal diffusion | ◯ | ◯ | ◯ | ◯ | ◯ | ◯ | X | ◯ |

A based . . . acryl based adhesive

TABLE 4

|  | Examples | | | |
| --- | --- | --- | --- | --- |
|  | 3-a | 3-b | 3-c | 3-d |
| Adhesive layer | Yes | Yes | Yes | Yes |
| Material | A based | A based | A based | A based |
| Thickness(μm) | 30 | 30 | 30 | 30 |
| Location | Multi-dot form | Multi-dot form | Multi-dot form | Multi-dot form |
| Ratio (%) (relative to outer surface) | 4.0 | 4.0 | 4.0 | 4.0 |
| Thermal diffusion layer | Yes | Yes | Yes | Yes |
| Thickness (μm) | 130 | 80 | 250 | 375 |
| Value of thermal resistance (° C./W) | 0.055 | 0.052 | 0.068 | 0.086 |
| Properties in terms of thermal diffusion | ◯ | ◯ | ◯ | ◯ |

A based . . . acryl based adhesive

As shown in Table 1, excellent evaluation results were obtained for each item of the polymer layer 12 in each example. Therefore, the polymer layer 12 in each example had excellent thermal conductance and was easy to handle. As shown in Tables 2 to 4, excellent evaluation results were obtained for each item of the sheet 11 in each example. Therefore, no great increase could be observed in the thermal contact resistance for the sheet 11 in each example on the adhesive layer 13, and the sheet 11 had excellent properties in terms of thermal diffusion on the basis of the thermal diffusion layer 14 made of a graphite sheet. As shown in FIG. 13A, in Example 1-a, heat diffused throughout the entirety of the sheet 11, and the temperature in the center portion was 81.7° C. In addition, the sheet 11 in each example had a low adhesiveness on the polymer layer 12, and thus, was very easy to handle.

As shown in Tables 2 and 3, the value of the thermal resistance for the sheets 11 according to Examples 1-a and 2-a were each lower than the value of the thermal resistance for the sheets 11 according to Examples 1-c and 2-c. That is to say, the thickness of the adhesive layers 13 in Examples 1-c and 2-c was as great as 60 μm, and therefore, the value of the thermal contact resistance was higher than for the sheets 11 in Examples 1-a and 2-a.

In addition, the value of the thermal resistance for the sheets 11 in Examples 1-d and 2-d were each lower than the value of the thermal resistance for the sheets 11 in Examples 1-f and 2-f. The ratio of the area of the polymer layer 12 occupied by the adhesive layer 13 to the area of the entirety of one outer surface 12a to which the adhesive layer 13 is attached was high in Examples 1-d and 2-d in comparison with Examples 1-f and 2-f, respectively. As described above, even in the case where the ratio of the area occupied by the adhesive layer 13 to the area of the entirety of the outer surface 12a of the polymer layer 12 is great, the adhesive layer 13 is formed in the peripheral portion of the polymer layer 12, and thus, it was found that the value of the thermal contact resistance of the sheet 11 can be decreased in comparison with the case where the adhesive layer 13 is formed in the center portion of the polymer layer 12.

In addition, the ratio of the above described area in Examples 1-e and 2-e was high for both in comparison with Examples 1-d and 2-d, respectively, and exceeded 30%. Therefore, it was found that the value of the thermal contact resistance for the sheet can be decreased by setting the ratio of the above described area to 30% or less.

Meanwhile, in Comparative Examples 1-a and 2-a, there was no thermal diffusion layer 14, and therefore, the properties in terms of thermal diffusion received a low evaluation. In Comparative Examples 1-b and 2-b, the adhesive layer 13 was formed throughout the entirety of the polymer layer 12, and therefore, the value of the thermal contact resistance for the sheet became high. In addition, as shown in FIG. 13B, heat did not diffuse in Comparative Example 1-a, and the temperature in the center portion was 200° C. or higher.

EXAMPLES OF SECOND EMBODIMENT

Examples 4-a to 4-d

In Example 4-a, as shown in Table 5, the sheet 11 was obtained in the same manner as in Example 3-a, except that the thermal diffusion layer 14 was changed to the conductive layer 17 made of an aluminum foil (thickness: 12 μm). In Example 4-b, as shown in Table 5, the sheet 11 was obtained in the same manner as in Example 4-a, except that the aluminum foil was changed to a copper foil (thickness: 8 μm). In Example 4-c, as shown in Table 5, the sheet 11 was obtained in the same manner as in Example 4-a, except that the aluminum foil was changed to a copper foil (thickness: 12 μm). In Example 4-d, as shown in Table 5, the sheet 11 was obtained in the same manner as in Example 4-a, except that the aluminum foil was changed to a copper foil (thickness: 18 μm).

Then, the value of the thermal resistance and the following items were measured for the sheet 11 in each example. The results are shown in Table 5.

Electrical Conductance

The volume resistivity (Ω·cm) of the conductive layer 17 in the sheet 11 was measured using a resistivity meter (MCP-T500, made by Dia Instruments Co., Ltd.) in accordance with JIS K 7194.

As shown in Table 5, excellent results were obtained for each item of the sheet 11 in each example. Therefore, the sheet 11 in each example had excellent thermal conductivity and electrical conductivity. In addition, the sheet 11 in each example had a low adhesiveness on the polymer layer 12, and thus, was very easy to handle.

EXAMPLES AND COMPARATIVE EXAMPLE OF THIRD EMBODIMENT

Examples 5-a to 5-c

In Example 5-a, as shown in Table 6, the sheet 11 was obtained in the same manner as in Example 3-a, except that the thermal diffusion layer 14 was changed to the electrically insulating layer 18 made of a PET film (thickness: 5 μm). In Example 5-b, as shown in Table 6, the sheet 11 was obtained in the same manner as in Example 3-a, except that the PET film was changed to a polyolefin film (thickness: 12 μm). In Example 5-c, as shown in Table 6, the sheet 11 was obtained in the same manner as in Example 3-a, except that the PET film was changed to a PVC film (thickness: 5 μm).

Comparative Example 5-a

In Comparative Example 5-a, as shown in Table 6, a sheet was obtained in the same manner as in Example 5-a, except that the adhesive layer 13 (thickness: 10 μm) was formed throughout the entirety of the outer surface of the polymer layer 12.

Then, the value of the thermal resistance and the following items were measured for the sheet in each example and comparative example. The results are shown in Table 6.

Dielectric Breakdown Voltage

The dielectric breakdown voltage (kV) of the sheet was measured using a withstand voltage testing machine (TOS8650, made by Kikusui Electronics Corporation) in accordance with JIS C 2110 (IEC 243, which is an international standard). The dielectric breakdown voltage indicates the voltage when a current flows through an electrical insulating sample when the sample is sandwiched between two electrodes and then the voltage is gradually increased to such a point that the current increases dramatically and a portion of the sample is melted and carbonized, or a hole is created.

TABLE 5

|  | Examples | | | |
| --- | --- | --- | --- | --- |
|  | 4-a | 4-b | 4-c | 4-d |
| Adhesive layer | Yes | Yes | Yes | Yes |
| Material | A based | A based | A based | A based |
| Thickness(μm) | 30 | 30 | 30 | 30 |
| Location | Multi-dot form | Multi-dot form | Multi-dot form | Multi-dot form |
| Ratio (%) (relative to outer surface) | 4.0 | 4.0 | 4.0 | 4.0 |
| Conductive layer | Aluminum foil | Copper foil | Copper foil | Copper foil |
| Thickness (μm) | 12 | 8 | 12 | 18 |
| Value of thermal resistance (° C./W) | 0.042 | 0.057 | 0.058 | 0.059 |
| Volume resistivity (Ω · cm) | $3.994 \times 10^{-6}$ | $2.439 \times 10^{-6}$ | $2.439 \times 10^{-6}$ | $2.439 \times 10^{-6}$ |

A based . . . acryl based adhesive

TABLE 6

|  | Examples | | | Comparative examples |
| --- | --- | --- | --- | --- |
|  | 5-a | 5-b | 5-c | 5-a |
| Adhesive layer | Yes | Yes | Yes | Yes |
| Material | A based | A based | A based | A based |
| Thickness(μm) | 30 | 30 | 30 | 10 |
| Location | Multi-dot form | Multi-dot form | Multi-dot form | Entire surface |
| Ratio (%) (relative to outer surface) | 4.0 | 4.0 | 4.0 | 100 |
| Electrically insulating layer | PET | Polyolefin | PVC | Polyolefin |
| Thickness (μm) | 5 | 12 | 5 | 12 |
| Value of thermal resistance (° C./W) | 0.099 | 0.097 | 0.105 | 0.129 |
| Dielectric breakdown voltage (kV) | 1.5 | 2.6 | 1.4 | 2.9 |

A based . . . acryl based adhesive

As shown in Table 6, excellent results were obtained for each item of the sheet 11 in each example. Therefore, the sheet 11 in each example had excellent thermal conductivity and electrical insulating properties. In addition, the sheet 11 in each example had a low adhesiveness for the polymer layer 12, and thus, was very easy to handle. Meanwhile, in Comparative Example 5-a, the adhesive layer 13 is formed throughout the entirety of the polymer layer 12, and therefore, the value of the thermal resistance became high.

Therefore, the present examples and embodiments are to be considered as illustrative and not restrictive and the invention is not to be limited to the details given herein, but may be modified within the scope and equivalence of the appended claims.

The invention claimed is:

1. A thermally and electrically conductive sheet configured to discharge heat from a heat discharging body, the heat being generated from a heat emitting body, and to prevent electrostatic discharge due to charging of the heat emitting body, the thermally and electrically conductive sheet comprising:
   an electrically conductive layer located on the heat emitting body, the electrically conductive layer having a central portion that contacts the heat emitting body and a peripheral portion that contacts the heat discharging body; and
   a thermally conductive polymer layer located between the central portion of the electrically conductive layer and the heat discharging body and comprising a polymer matrix and a filler in fiber form;
   wherein the filler is oriented in a direction of a thickness of the thermally conductive polymer layer, wherein the polymer matrix and the filler contact the electrically conductive layer and the heat discharging body to transfer the heat from the heat emitting body to the heat discharging body, and wherein the electrically conductive layer allows a current to flow from the heat emitting body to the heat discharging body due to the contact of the peripheral portion of the electrically conductive layer with the heat discharging body.

2. The thermally and electrically conductive sheet according to claim 1, wherein a coefficient of static friction of the thermally conductive polymer layer is 1.0 or lower.

3. The thermally and electrically conductive sheet according to claim 1, wherein a coefficient of static friction of the thermally conductive polymer layer is 0.3 or lower.

4. The thermally and electrically conductive sheet according to claim 1, wherein the thickness of the thermally conductive polymer layer is 0.03 mm to 0.5 mm.

5. The thermally and electrically conductive sheet according to claim 1, wherein an adhesive layer is provided on an outer surface of the thermally conductive polymer layer to be located between the conductive layer and the thermally conductive polymer layer.

6. The thermally and electrically conductive sheet according to claim 5, wherein a thickness of the adhesive layer is 50 μm or less.

7. The thermally and electrically conductive sheet according to claim 5, wherein a ratio of area occupied by the adhesive layer to area of the entirety of the surface of the thermally conductive polymer layer on which the adhesive layer is provided is 30% or less.

8. The thermally and electrically conductive sheet according to claim 7, wherein the adhesive layer is provided as a number of pieces in multi-dot form over the entirety of the surface of the thermally conductive polymer layer.

9. The thermally and electrically conductive sheet according to claim 7, wherein the adhesive layer is provided throughout the entirety of the peripheral portion of the thermally conductive polymer layer.

10. The thermally and electrically conductive sheet according to claim 1, wherein the thickness of the electrically conductive layer is 20 μm or less.

11. The thermally and electrically conductive sheet according to claim 10, wherein the thickness of the electrically conductive layer is 2 μm to 14 μm.

12. A thermally and electrically conductive sheet configured to discharge heat from a heat discharging body, the heat being generated from a heat emitting body, and to prevent electrostatic discharge due to charging of the heat emitting body, the thermally and electrically conductive sheet comprising:
   a thermally conductive polymer layer including a polymer matrix and a filler in fiber form contained in the polymer matrix, wherein the filler is oriented in a direction of a thickness of the thermally conductive polymer layer and exposed from a surface of the polymer matrix; and
   an electrically conductive layer having a central portion and a peripheral portion, wherein the central portion has a first surface that contacts the thermally conductive polymer layer and a second surface that is configured to contact the heat emitting body, and wherein the peripheral portion of the electrically conductive layer contacts the heat discharging body.

* * * * *